United States Patent
Suzuki

(10) Patent No.: US 8,847,180 B2
(45) Date of Patent: Sep. 30, 2014

(54) CHARGED PARTICLE BEAM APPARATUS, DRAWING APPARATUS, AND METHOD OF MANUFACTURING ARTICLE

(71) Applicant: Canon Kabushiki Kaisha, Tokyo (JP)

(72) Inventor: Takehiko Suzuki, Satte (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/772,419

(22) Filed: Feb. 21, 2013

(65) Prior Publication Data

US 2013/0224662 A1    Aug. 29, 2013

(30) Foreign Application Priority Data

Feb. 28, 2012  (JP) ................. 2012-042386

(51) Int. Cl.
| | | |
|---|---|---|
| *G21K 5/04* | (2006.01) | |
| *H01J 37/317* | (2006.01) | |
| *G03F 7/20* | (2006.01) | |
| *H01J 37/244* | (2006.01) | |

(52) U.S. Cl.
 CPC .............. *H01J 37/3174* (2013.01); *G03F 7/20* (2013.01); *H01J 37/3177* (2013.01); *H01J 2237/30438* (2013.01); *H01J 2237/24535* (2013.01); *H01J 37/244* (2013.01)
 USPC ................. 250/492.3; 250/492.1; 250/396 R; 250/397

(58) Field of Classification Search
 USPC ................. 250/492.1, 492.2, 492.21, 492.22, 250/492.23, 492.3, 396 R, 397
 See application file for complete search history.

(56) References Cited

U.S. PATENT DOCUMENTS

| | | | |
|---|---|---|---|
| 2004/0094712 A1* | 5/2004 | Kaji et al. ..................... | 250/310 |
| 2005/0029473 A1 | 2/2005 | Muraki et al. | |
| 2005/0121611 A1* | 6/2005 | Kimba et al. ................. | 250/311 |

FOREIGN PATENT DOCUMENTS

JP    2005-056923 A    3/2005

* cited by examiner

*Primary Examiner* — Nicole Ippolito
(74) *Attorney, Agent, or Firm* — Rossi, Kimms & McDowell LLP

(57) ABSTRACT

A charged particle beam apparatus, which processes an object with a charged particle beam, includes: a detector having a detection surface, and configured to detect a charged particle beam incident on a partial region of the detection surface; and a controller configured to make target incident positions of charged particle beams, to be sequentially incident on the detection surface, different from each other.

11 Claims, 11 Drawing Sheets

FIG. 6

| EXTERNAL COMMAND PARAMETER | INTERNAL MANAGEMENT PARAMETER | MANAGEMENT DETERMINATION |
|---|---|---|
| COORDINATES OF STAGE POSITION | COORDINATES OF INCIDENT POSITION ON DETECTOR | DIFFERENT INCIDENT REGIONS |
| DEFLECTOR COMMAND PARAMETER | INCIDENCE TIME AT INCIDENT POSITION ON DETECTOR | SENSITIVITY CORRECTION REGION |
| INCIDENCE TIME OF ELECTRON BEAM | SENSITIVITY TABLE OF COORDINATES OF INCIDENT POSITION WITHIN PLANE OF DETECTION SURFACE | (INTENSITY OF ELECTRON BEAM) × (INCIDENCE TIME) |

$X = LX * RAND(X)$
$Y = LY * RAND(Y)$ $0 < RAND(X) < 1$
$0 < RAND(Y) < 1$

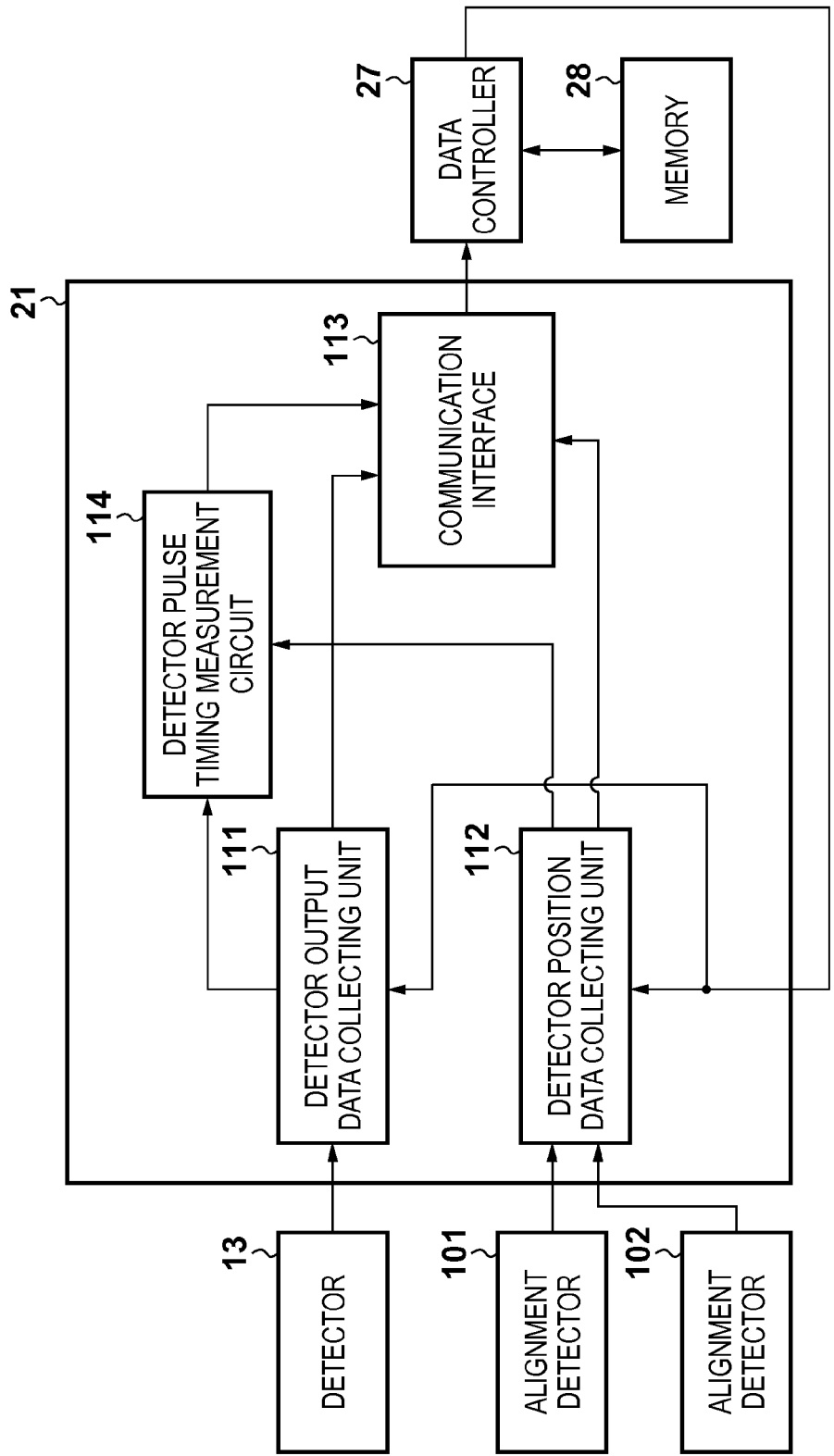

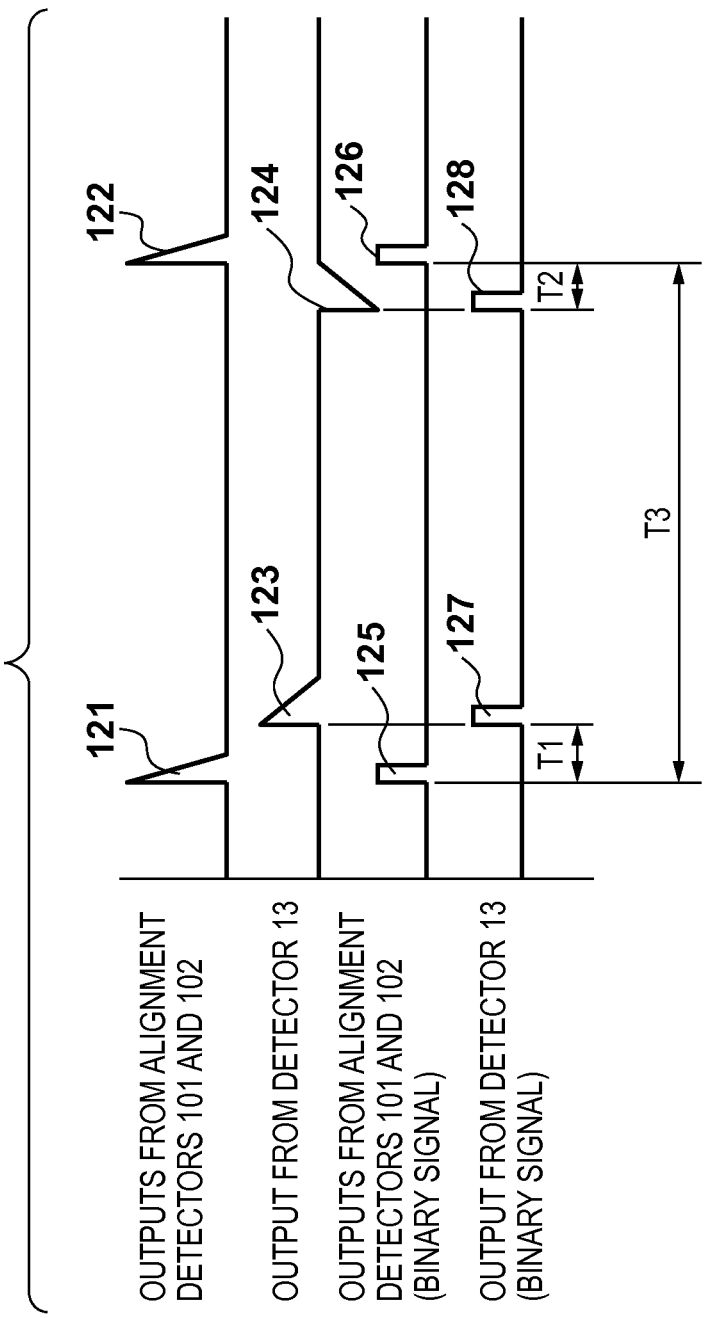

CHARGED PARTICLE BEAM APPARATUS, DRAWING APPARATUS, AND METHOD OF MANUFACTURING ARTICLE

BACKGROUND OF THE INVENTION

1. Field of the Invention

The present invention relates to a charged particle beam apparatus which processes an object with a charged particle beam, a drawing apparatus, and a method of manufacturing an article.

2. Description of the Related Art

An apparatus which processes an object with a charged particle beam, such as an electron beam drawing apparatus (electron beam exposure apparatus) or a scanning electron microscope, has a function of measuring and adjusting the intensity of the charged particle beam. An electron beam drawing apparatus will be taken as an example. Conventionally, to measure the intensity of an electron beam, a detector such as a Faraday cup, or a photodiode having a function of multiplying electrons is used. As the amount of charges gets smaller, the S/N ratio lowers in the Faraday cup, so the charge output is measured using a detector such as a photodiode, as disclosed in Japanese Patent Laid-Open No. 2005-56923. The electron beam drawing apparatus monitors and adjusts the intensity of an electron beam to control, for example, the line width of a pattern to be drawn.

The width of a pattern to be drawn reduces each year. With a reduction in pattern width, the size of an electron beam also reduces. To draw, for example, a pattern having a line width of 22 nm, the beam must have a size equal to or half that of this line width. Also, to perform drawing at high speed, an electron beam with a high intensity is emitted in a short time. When the line width of a pattern is not minute, the beam size used in the electron beam drawing apparatus can be increased. However, in a drawing apparatus which uses a plurality of electron beams, no lens for increasing the beam size can be interposed between an objective lens and a stage which holds a substrate. Therefore, the energy density of an electron beam increases, so a 1-nm$^2$ region is irradiated with an electron beam having an accelerating voltage of several tens of kiloelectronvolts.

When an electron beam having a given energy is incident on a detector (for example, a semiconductor detector formed by, for example, Si or Ge) having a function of multiplying electrons, charges (electron-hole pairs) are generated in correspondence with the number of incident electrons. The detector can output a voltage signal by converting the generated charge into a voltage using an amplifier. The detector also can extract a current resulting from the generated charge as a voltage signal via an amplifier which converts a current into a voltage.

When the surface of a detector which monitors the intensity of an electron beam, and an internal thin film are irradiated with an electron beam having a high charge density for a long time, the detector suffers damage. When the detector suffers damage, the efficiency of generating charges by the detector decreases. The decrease in efficiency of charge generation leads to a reduction in signal output, that is, degradation in sensitivity of the detector when the intensity of an electron beam is measured. When an electron beam is incident only on a specific region on the detection surface of the detector, the sensitivity in the specific region on the detection surface degrades. When the sensitivity of the detection surface varies, the magnitude of the output signal varies depending on the incident position of an electron beam on the detector, so the intensity of the electron beam cannot be measured with high accuracy.

FIG. 4 shows the procedure of measuring the intensity of an electron beam in the conventional technique. In step S1, the detector moves to a predetermined position at which the intensity of an electron beam is measured. In step S2, the intensity of an electron beam is measured. In step S3, data corresponding to the intensity of the electron beam obtained by measurement is stored. If it is determined in step S4 that an electron beam to be measured remains, steps S1, S2, and S3 are repeated; otherwise, the sequence of measurement ends. In the conventional technique, the incident position of an electron beam on the detector is not changed. Therefore, the incident region of an electron beam is the same region which has a certain size and depends on the positioning accuracy of a stage on which the detector is set, and the control accuracy of the incident position of the electron beam. That is, in the conventional technique, an electron beam is incident on the same region of the detector every time the intensity of the electron beam is measured. This means that the sensitivity at which the detector outputs a charge degrades as the detection region of the detector suffers damage upon incidence of an electron beam for a long time.

In the conventional technique, no measure is taken against degradation in sensitivity of the detector due to factors associated with incidence of a charged particle beam on the same region.

SUMMARY OF THE INVENTION

The present invention provides, for example, a charged particle beam apparatus advantageous in terms of accuracy of intensity measurement for a charged particle beam.

The present invention in its one aspect provides a charged particle beam apparatus which processes an object with a charged particle beam, the apparatus comprising: a detector having a detection surface, and configured to detect a charged particle beam incident on a partial region of the detection surface; and a controller configured to make target incident positions of charged particle beams, to be sequentially incident on the detection surface, different from each other.

Further features of the present invention will become apparent from the following description of exemplary embodiments with reference to the attached drawings.

BRIEF DESCRIPTION OF THE DRAWINGS

FIG. 6 is a table illustrating an example of a parameter management table;

FIG. 11 is a block diagram showing the configuration of a data collecting unit; and FIG. 12 is a timing chart for detecting the incident position of an electron beam on a detector.

DESCRIPTION OF THE EMBODIMENTS

First Embodiment

In the first embodiment, the present invention will be described by taking a drawing apparatus, which performs drawing on a substrate with a plurality of electron beams, as an example of a charged particle beam apparatus which processes an object with a plurality of charged particle beams.

<Configuration of Drawing Apparatus>

Figure 1:
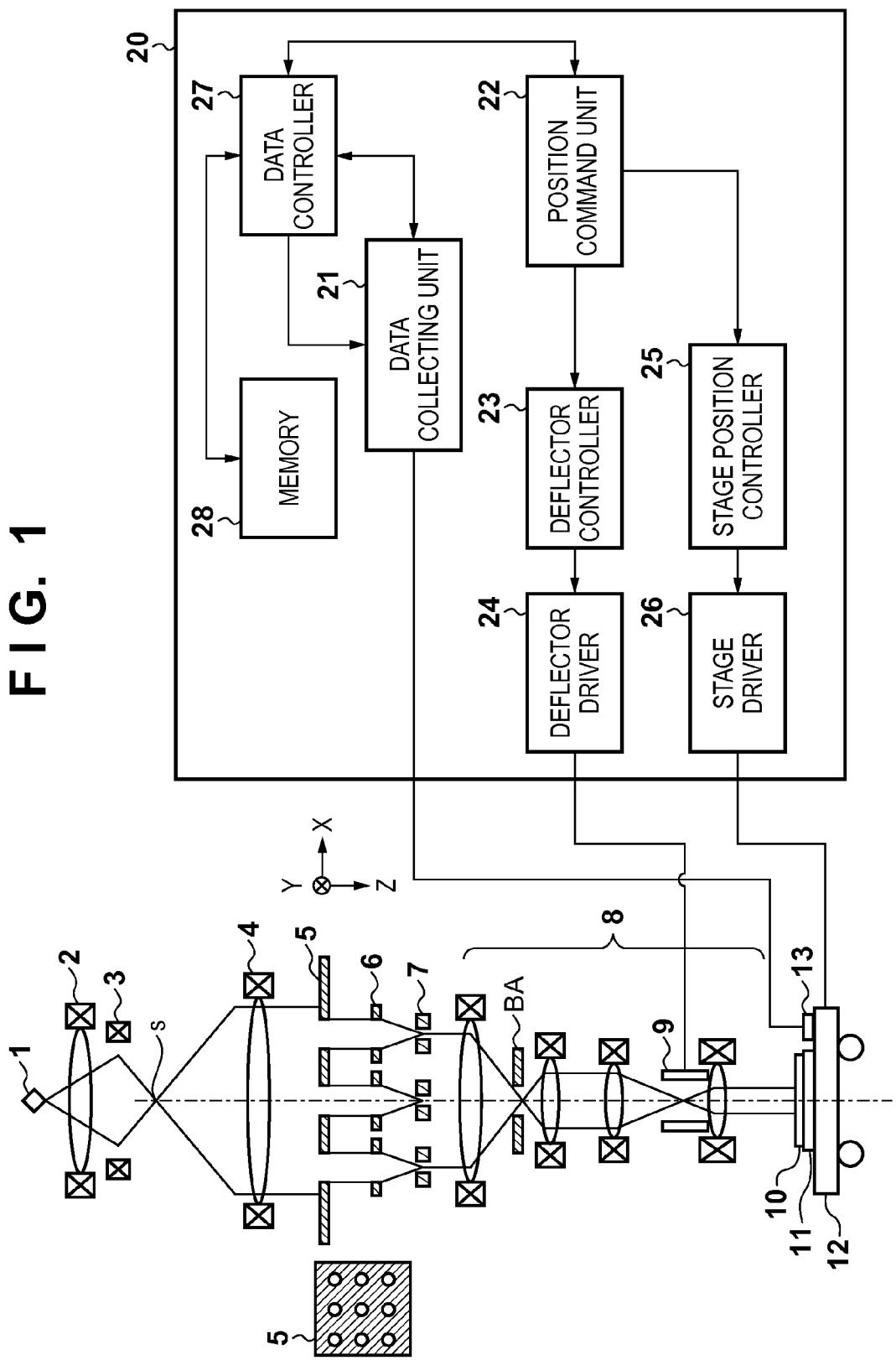
FIG. 1 is a view showing the configuration of a drawing apparatus.

Referring to FIG. 1, an electron beam emitted by an electron gun (not shown) forms a crossover image (electron source) 1. The electron beam emitted by the electron source 1 forms an image S of the electron source 1 via an electron optical system 2 which shapes the electron beam. An astigmatism meter 3 can generate astigmatism in the image S. The electron beam that has emanated from the image S is converted into a nearly collimated electron beam by a collimator lens 4. The nearly collimated electron beam is incident on an aperture array 5 having a plurality of apertures. The aperture array 5 has a plurality of apertures, and the nearly collimated electron beam is split into a plurality of electron beams upon passing through these apertures. The plurality of electron beams split by the aperture array 5 form intermediate images of the image S by an electrostatic lens array 6 in which a plurality of electrostatic lenses are formed. A blanker array 7 in which a plurality of blankers are formed is located on the intermediate image plane.

An electron optical system (projection system) 8 is located downstream of the intermediate image plane, and a plurality of intermediate images are projected onto a wafer (substrate) 10. At this time, an electron beam deflected by the blanker array 7 is blocked by a blanking aperture BA, and therefore is not incident on the wafer 10. On the other hand, an electron beam which is not deflected by the blanker array 7 is not blocked by the blanking aperture BA, and is therefore incident on the wafer 10. That is, the blanker array 7 individually turns on/off the plurality of electron beams. A deflector 9 simultaneously displaces the plurality of electron beams to desired positions in the X- and Y-directions. A stage 12 holds the wafer 10 and can move in the X- and Y-directions perpendicular to the axis of the electron optical system 8.

An electrostatic chuck 11 and detector (electron beam detector) 13 are located on the stage 12. The electrostatic chuck 11 serves to hold the wafer 10 in position. The detector 13 has a function of multiplying incident electrons as a plurality of electron beams are directly incident on it, and measures the relative value of the intensity of each electron beam. A detector which uses a semiconductor, such as a silicon photodiode, can be used as the detector 13. A commercially-available light detection photodiode can also be used as the detector 13. The difference between a light detection photodiode and an electron beam detection photodiode is that in gain. The detection surface of a commercially-available light detection photodiode has a size of several millimeters×several millimeters. The detection surface of each detection element of a detector including a plurality of detection elements, such as a CCD, has a size of several micrometers×several micrometers. Because the electron beam has a size of several nanometers, the detector 13 has a detection surface with an area sufficiently larger than that of an electron beam, and detects an electron beam incident on a partial region of the detection surface. In the first embodiment, a detector 13 with a detection surface which has a size of several millimeters×several millimeters and can be used to detect a charged particle beam, radiation, or photons is used. At least one of the deflector 9 and a driver (not shown) which drives the stage 12 changes the target incident position of an electron beam on the detection surface of the detector 13 to change the incident position of an electron beam on this detection surface.

A controller 20 includes a control system associated with an operation of measuring the intensity of an electron beam using the detector 13. A data collecting unit 21 collects a charge signal output from the detector 13. The charge signal output from the detector 13 corresponds to the intensity of an electron beam incident on the detector 13. The charge signal is converted into digital data by the data collecting unit 21, and stored in a memory 28. A data controller 27 controls this data. A position command unit 22 specifies the incident position and scanning range of an electron beam. A deflector controller 23 controls the deflector 9 to control the incident position and scanning range of an electron beam in the X- and Y-directions. A deflector driver 24 converts a digital signal from the deflector controller 23 into analog data, and outputs a drive current to a deflector coil which forms the deflector 9.

A stage position controller 25 controls the position of the stage 12. The stage 12 can move the detector 13 to positions, on which the electron beams are sequentially incident, by interlocking with the deflector 9. A stage driver (driving device) 26 converts a digital signal corresponding to a stage position drive command received from the stage position controller 25 into analog data, and supplies a current to the coil of a linear motor which drives the stage 12. The stage 12 can move to a position at which the detector 13 measures the intensity of an electron beam. Position data of the stage 12 can be obtained by an interferometer (not shown). The data controller 27 and position command unit 22 can perform data communication. The X- and Y-coordinate positions of the stage 12 measured in the past are stored in the memory 28. The position command unit 22 can look up the X- and Y-coordinate positions of the stage 12 measured in the past by data communication with the data controller 27.

Figure 2:
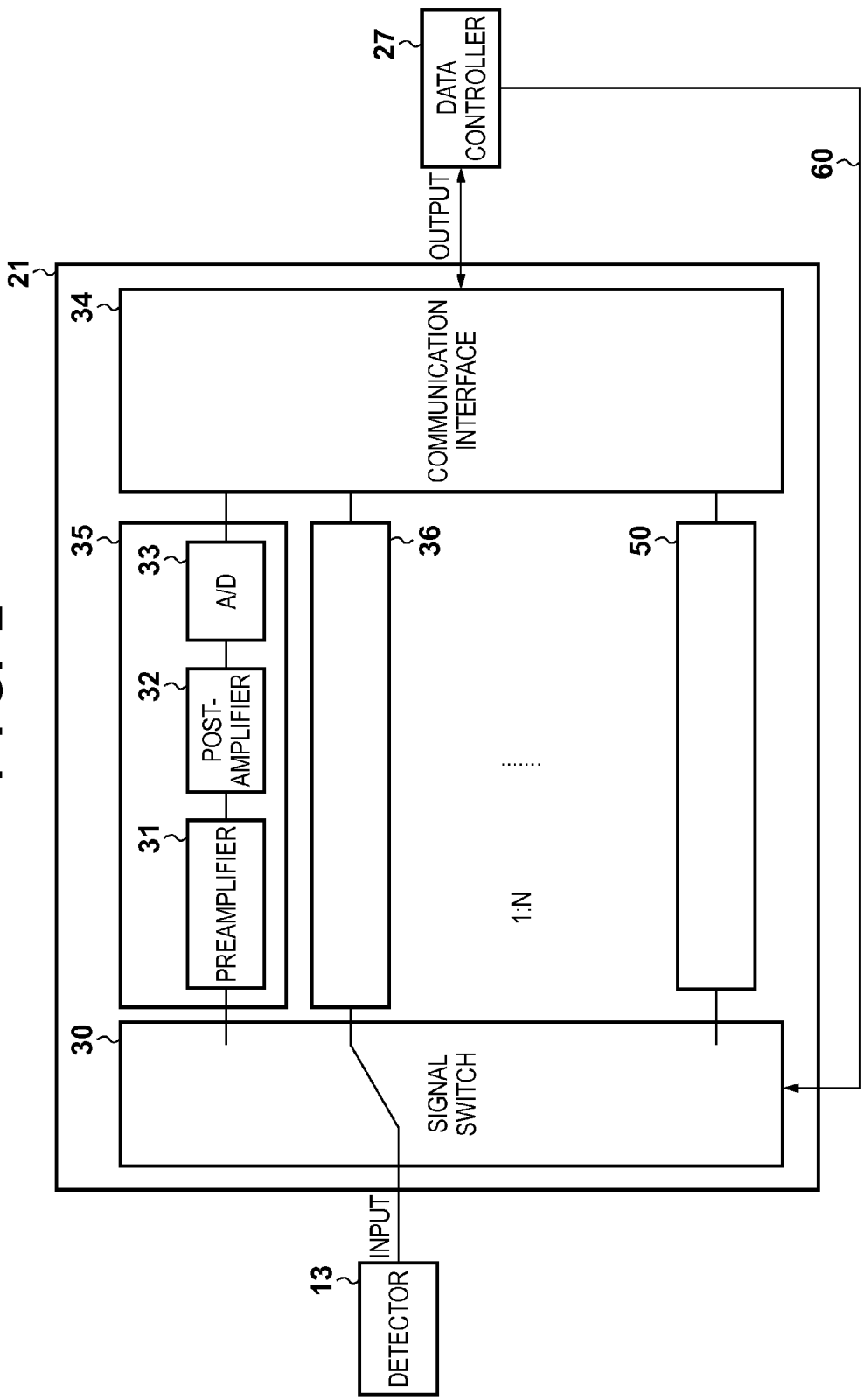
FIG. 2 is a block diagram showing the configuration of a data collecting unit.

FIG. 2 shows the detailed configuration of the data collecting unit 21. The data collecting unit 21 includes a signal switch 30, signal processing circuit 35, and communication interface 34. The signal switch 30 has a function of switching a charge signal output from the detector 13 into a plurality of signal processing circuits 35. The switching timing, and the portion to be connected to the plurality of signal processing circuits 35 are controlled by the data controller 27 using a timing control signal 60. The signal processing circuit 35 includes a preamplifier 31 having a function of converting a charge into a voltage, a post-amplifier 32 which has a peak hold function and shapes a pulse waveform from the preamplifier 31, and an A/D converter 33 having an analog-to-digital conversion function.

Digital data corresponding to the intensities of electron beams from a plurality of signal processing circuits 35 is output from the data controller 27 via the communication interface 34, and stored in the memory 28. When an electron beam is incident on the detector 13, the detector 13 generates a charge. The generated charge is converted into a voltage signal by the preamplifier 31. Since an electron beam is intermittently incident on the detector 13, the preamplifier 31 outputs a pulsed signal. The post-amplifier 32 shapes a pulsed analog signal output from the preamplifier 31, and performs peak hold of a peak signal. The A/D converter 33 converts an analog signal having undergone peak hold by the post-amplifier 32 into a digital signal. Digital data corresponding to the intensity of an electron beam is output to the data controller 27 via the communication interface 34.

<Detection Operation of Intensity of Electron Beam>

A method of detecting the intensities of a plurality of electron beams by the detector 13 will be explained. A method of controlling a plurality of electron beams when their intensities are measured will be described first. Each electron beam undergoes ON/OFF control by blanker control. Scanning and step movement of each electron beam are performed by the deflector 9. The data controller 27 issues an instruction to the deflector controller 23 via the position command unit 22 to drive the deflector 9 by the deflector driver 24. The deflector 9 collectively deflects a plurality of electron beams. The data controller 27 simultaneously instructs a blanker array control circuit (not shown) to individually turn on/off the blankers of the blanker array 7. An electron beam which passes through any of the blankers passes through the electron optical system 8, while an electron beam which does not pass through any of the blankers is not incident on the electron optical system 8.

Although not shown, the deflector 9 includes a main deflector used if the deflection width is wide, and a sub deflector used if the deflection width is narrow. The main deflector serves as an electromagnetic deflector, while the sub deflector serves as an electrostatic deflector. The scanning of each electron beam is performed by the electrostatic sub deflector, while the step movement of this electron beam is performed by the electromagnetic main deflector. The drawing apparatus uses several tens of thousands to several hundred thousand electron beams. It takes a time corresponding to the number of electron beams to measure the intensities of all electron beams. Hence, the intensities of all of a plurality of electron beams may be measured over a considerable time in advance, and the intensities of only representative electron beams positioned on the periphery may be measured subsequently. One or a plurality of electron beams may be collectively incident on the detector 13. As long as the number of electron beams that are simultaneously incident on the detector 13, and their incident portions are known, the detection result can be managed.

Figure 3:
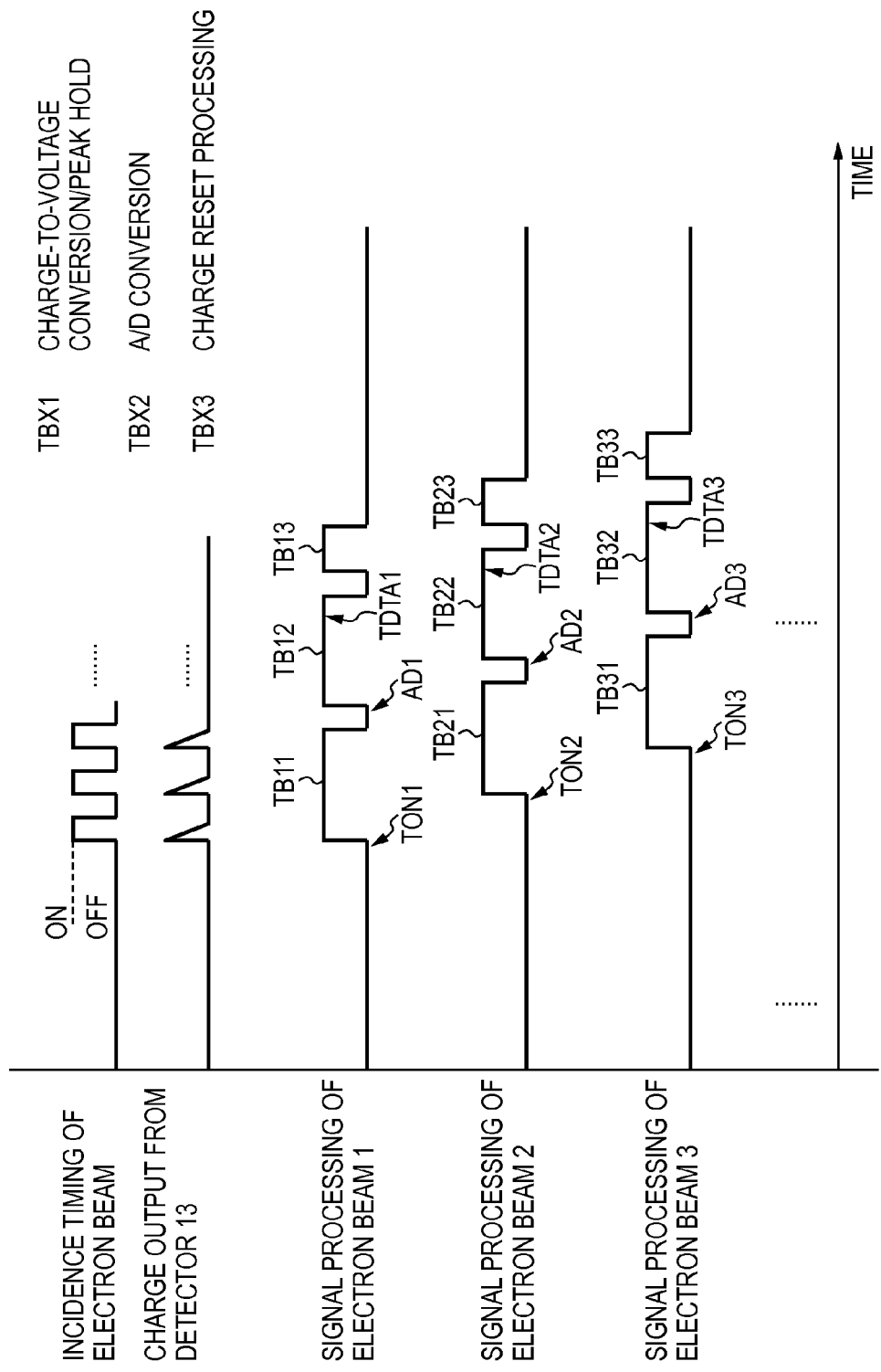
FIG. 3 is a timing chart for obtaining the intensity data of an electron beam.
Figure 4:
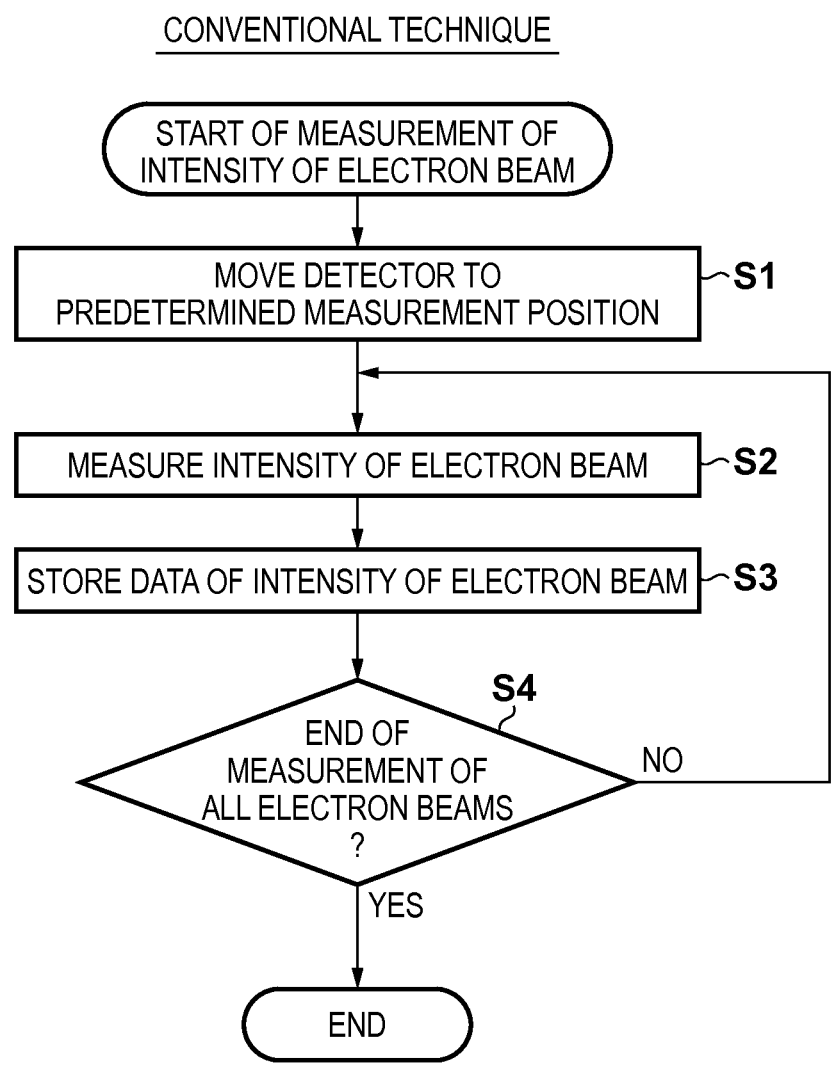
FIG. 4 is a flowchart for measuring the intensity of an electron beam in the conventional technique.

Assume that the stage 12 is at a coordinate position at which the detector 13 can detect the intensity of an electron beam. The position of the stage 12 can be controlled by a laser interferometer with high accuracy. FIG. 3 is a timing chart in which some of a plurality of electron beams are sequentially turned on to be incident on the detector 13, and charges generated by the detector 13 are sequentially extracted. In FIG. 3, time flows from the left to right. The timing chart indicates the electron beam incidence timing, the charge output from the detector 13, and the timings of signal processing of the first to Nth electron beams in the order named from the top. Note that N represents the number of electron beams selected from all electron beams. The electron beam incidence timing represents the ON and OFF states of the incidence. The charge output from the detector 13 represents a change in amount of charges output from the detector 13. The electron beam is incident on the detector 13 at the timing of a leading edge in which the incidence timing switches from OFF to ON. A charge is output from the detector 13 several tens of nanoseconds after an electron beam is incident on it. The output charge represents that the amount of charges from the detector 13 decreases as the charge migrates to the preamplifier 31 built into the signal processing circuit 35.

At the timing at which the amount of charges from the detector 13 becomes zero, the signal switch 30 switches from the signal processing circuit 35 for the first electron beam to a signal processing circuit 36 for the second electron beam. The incidence of an electron beam, and the switching of the signal processing circuit 35 are sequentially performed for the second to Nth electron beams. The positions at which the first to Nth electron beams are incident on the detector 13 are different from each other even when the position of the stage 12 is fixed.

The operations of signal processing circuits 35 to 50 will be described. The signal processing circuits 35 to 50 have the same circuit configuration. Signal processing of the first electron beam will be described as a typical example. Reference symbol TB11 denotes the time interval in which the preamplifier 31 converts a charge into a voltage, and the postamplifier 32 performs peak hold; TON1, the timing at which the first electron beam is turned on; and TB12, the time interval in which the A/D converter 33 performs an A/D conversion operation. The A/D conversion operation starts at a timing AD1, and digital data of the intensity of an electron beam is transferred to the data controller 27 via the communication interface 34 at a timing TDTA1. The digital data is further sent from the data controller 27 to the memory 28 and stored in the memory 28. In a time interval TB13 in which the data is held in the memory 28, the charge stored in the preamplifier 31 is reset and released to the circuit GND. The second to Nth electron beams are sequentially processed in synchronism with the incidence timing of an electron beam.

<Procedure of Measuring Intensity of Electron Beam>

Figure 5:
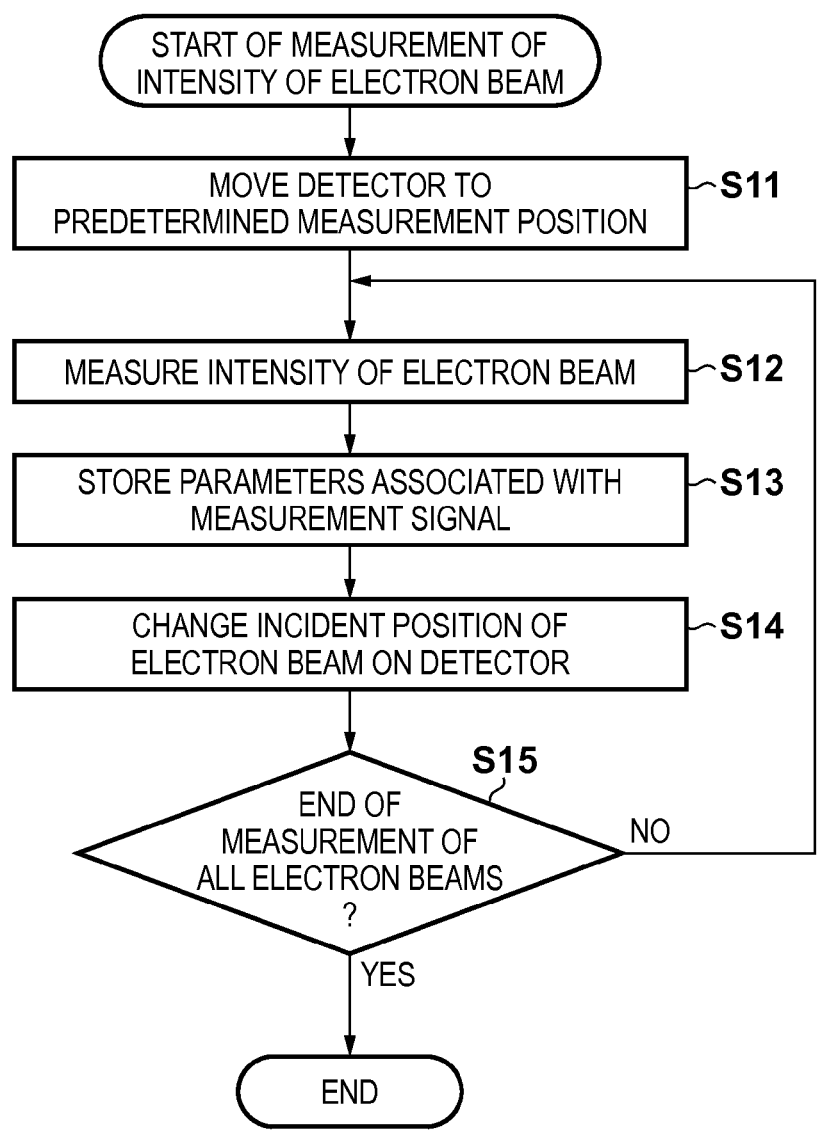
FIG. 5 is a flowchart for measuring the intensity of an electron beam in the present invention.

FIG. 5 shows the procedure of measuring the intensity of an electron beam in the first embodiment. In step S11, the controller 20 moves the detector 13 to a predetermined position at which the intensity of an electron beam can be measured. In step S12, the controller 20 measures the intensity of the first electron beam.

In step S13, the controller 20 stores a beam current measurement signal and parameters associated with it. The parameters associated with the measurement signal will be described with reference to FIG. 6. The parameters associated with the measurement signal include external command parameters which are to be issued to an external device and are required for position control of the stage 12, control of the deflector 9, and ON/OFF control of the blankers. The parameters associated with the measurement signal include, as internal management parameters associated with damage to the detector, the coordinates of the irradiated position on the detector 13, the electron beam irradiation time at this irradiated position, and the sensitivity table at the irradiated position on the detector 13.

The sensitivity table of the detector 13 will be described. The detector 13 has a nonuniform sensitivity on its entire surface, and therefore has a given sensitivity distribution within the plane of the detection surface. To manage the sensitivity of the detector 13 with high accuracy, it is necessary to obtain data associated with the position and sensitivity within the plane of the detection surface of the detector 13 in advance, and correct the sensitivity based on the position within the plane of the detection surface in accordance with the time to irradiate the detector 13 with an electron beam. FIG. 6 also shows determination details to be managed for the irradiated position on the detector 13. The determination details include information indicating that the same irradiated region is not used, the sensitivity correction region, and (Beam Intensity×Incidence Time) as a parameter associated with the energy density of an electron beam.

In step S14, the controller 20 changes the incident position of an electron beam on the detector 13. Note that in the first embodiment, the incident position of an electron beam is changed once the intensity of an electron beam is measured. However, the incident position of an electron beam may be changed after the intensities of a plurality of electron beams are measured. Also, as the incident position of an electron beam depends on the positioning accuracy of the stage on which the detector is placed, and the control accuracy of the incident position of an electron beam, the electron beam is incident on a more or less wide range. Before at least one measurement operation, the incident position of an electron beam on the detection surface is changed to be different from that in an immediately preceding measurement operation. As a result, it is possible to prevent an electron beam from being incident on the same region of the detector 13 for a long time, and, in turn, to prevent degradation in sensitivity.

If it is determined in step S15 that an electron beam to be measured remains, the controller 20 repeats steps S12 to S14; otherwise, the sequence of measurement ends.

<Change in Incident Position>

To prevent degradation in sensitivity of the detector 13, it is necessary to change the incident position of an electron beam. To change the incident position of an electron beam, the following two methods, for example, are available. In the first method, the incident position on the detector 13 is regularly changed. In the second method, the incident position on the detector 13 is randomly changed.

Figure 7:
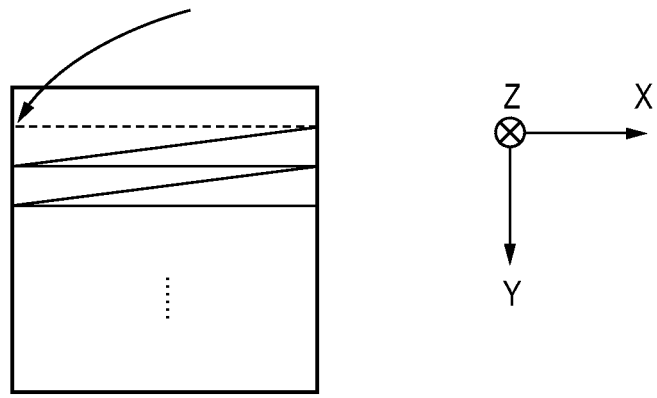
FIG. 7 is a view illustrating an example in which the incident position of an electron beam on a detector changes.

The first method of regularly changing the incident position will be described first. In this method, the coordinates of the incident position are changed based on a predetermined rule. For example, a method of determining the coordinates of the initial position of the incident position, adding a predetermined offset to the coordinates of the initial position, and changing the vector direction of these coordinates within the coordinate range is available. The vector direction can be determined by a combination of increments (+) and decrements (−) for the X- and Y-coordinates. Alternatively, a method of specifying the coordinates of the incident position as polar coordinates based on the rotation angle and axial length in the radial direction is possible. FIG. 7 illustrates an example of how to move the coordinates. An area surrounded by a square indicates a sensitive area as an electron beam is incident on the detector 13. Upon defining the initial coordinates as (X0, Y0), the incident position is changed so as to scan the entire area surface in predetermined steps. The intensities of all electron beams to be measured can be measured by sequentially repeating ON/OFF control of a plurality of electron beams in accordance with the procedure shown in FIG. 3.

Figure 8:
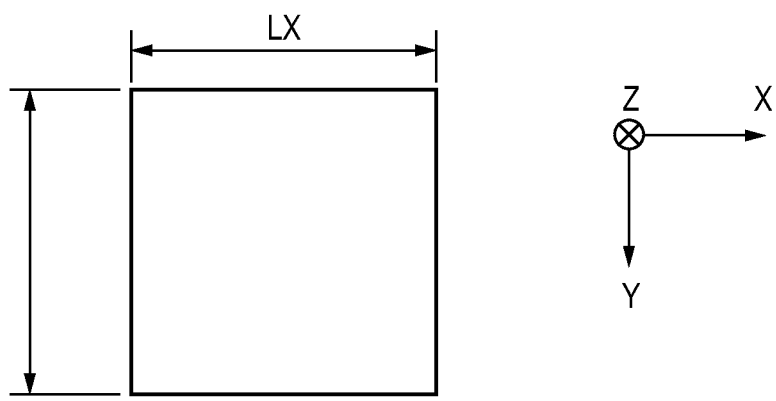
FIG. 8 is a view illustrating another example in which the incident position of an electron beam on the detector changes.

The second method of randomly changing the incident position will be described. The controller 20 determines the coordinate ranges of the X- and Y-coordinates of the incident region. The possible coordinate range is normalized into numerical values falling between 0 and 1. The controller 20 generates possible normalized numerical values as random numbers, and converts the random number values into position coordinates to determine the coordinates of the incident position. FIG. 8 shows the relationship between the X- and Y-coordinates of the incident position and spans LX and LY, in the X- and Y-directions, of a sensitive area on the detector 13. The coordinates of the incident position can be represented by coordinates obtained by integrating the possible spans LX and LY of the detector 13 with respect to a random number RAND(X) of the X-coordinate and a random number RAND(Y) of the Y-coordinate. At this time, the controller 20 can prevent the same coordinates from being selected by determining whether the coordinates determined once are identical to those determined in the past.

<Correction of Sensitivity of Detector>

The controller 20 measures the intensity of each electron beam while changing the incident position on the detector 13 as one or a plurality of electron beams are turned on, thereby obtaining the sensitivity data of the entire detection surface of the detector 13 in advance. At this time, the controller 20 stores the sensitivity data in association with the incident position data, the intensity data of an electron beam, and the measurement date. Also, the controller 20 measures changes in electron beam energy (Intensity×Incidence Time) and sensitivity as basic data to create a table representing the changes in coordinates and sensitivity of the incident position. When the controller 20 holds an internal table according to which the rate of change in sensitivity can be calculated as long as the coordinates of the incident position and the incidence time on the detector 13 are input as parameters, it can obtain numerical values in sensitivity correction for the incident position and incidence time to correct the sensitivity of the detector 13. When the coordinates on the detector 13 have uniform histogram characteristics, the sensitivity correction table need only be corrected for each incidence time at a relatively low frequency, so the time to correct the sensitivity can be shortened.

Figure 9:
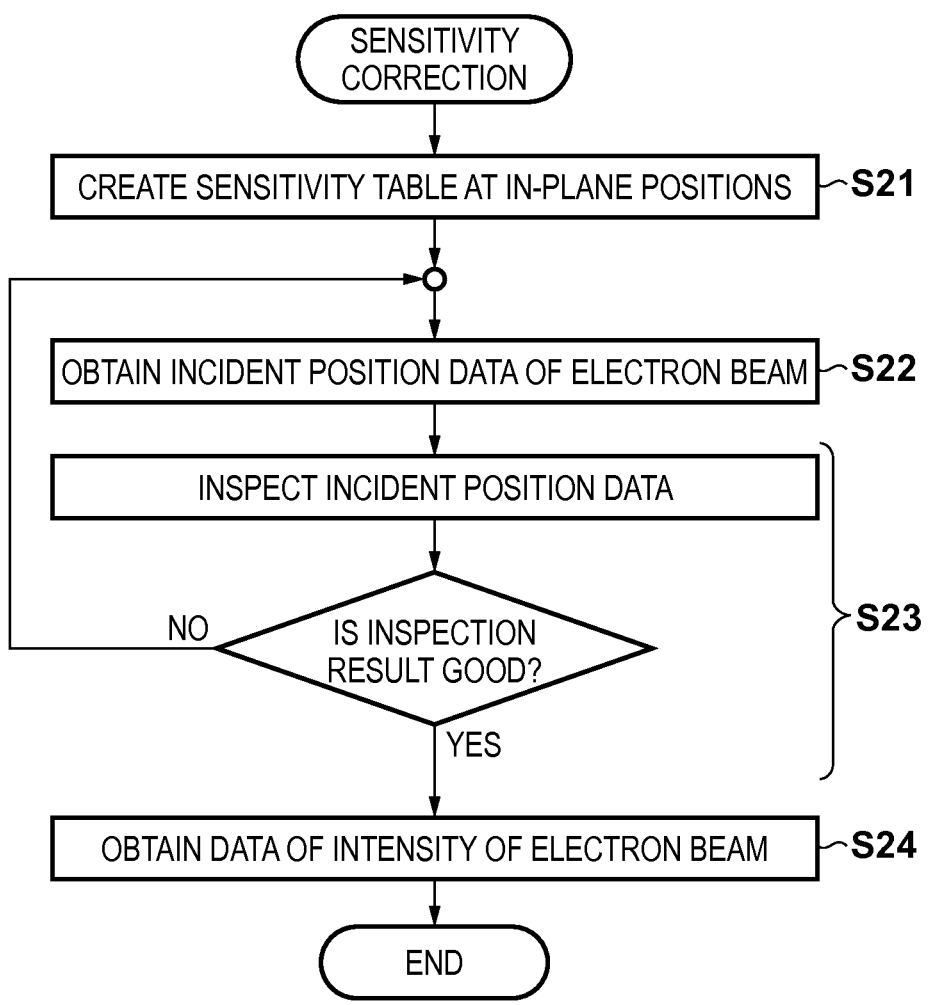
FIG. 9 is a flowchart for correcting the sensitivity.

FIG. 9 is a flowchart of the procedure of sensitivity correction. In step S21, the controller 20 obtains, in advance, the sensitivity at the position coordinates on the entire detection surface of the detector 13, which has a given sensitivity. In step S22, the controller 20 moves the detector 13 to the measurement position, and obtains the incident position of an electron beam on the detection surface of the detector 13. In step S23, the controller 20 inspects whether the coordinates of the obtained incident position were selected in the past. If the controller 20 collates the obtained incident position with the incident position data selected in the past, and determines that they are different from each other, it obtains the intensity data of the electron beam in step S24. If the controller 20 determines that the obtained incident position is identical to that selected in the past, it returns the process again to step S22, in which it obtains an incident position again. By executing the foregoing procedure, the intensity of an electron beam can be measured without doubly obtaining the same incident position of an electron beam. Upon repetitions of the procedure shown in FIG. 9, if it is no longer possible to pass the inspection operation in step S23, that is, coordinate data of all incident positions have been looked up, it is also possible to initialize the coordinate data of the incident position and repeat selection and setting of the incident position from the beginning. By obtaining basic data of the electron beam energy and change in sensitivity, it can be determined whether the sensitivity lowers to the degree that the incident position used once cannot be used again.

Second Embodiment

In a drawing apparatus which uses a plurality of electron beams, the interval between electron beams is as narrow as several tens of nanometers, so the drawing performance is adversely affected unless the position of each electron beam is controlled with high accuracy. How to change the incident position of an electron beam has been described in the first embodiment. How to detect the incident position of an electron beam with high accuracy will be described in the second embodiment.

Figure 10:
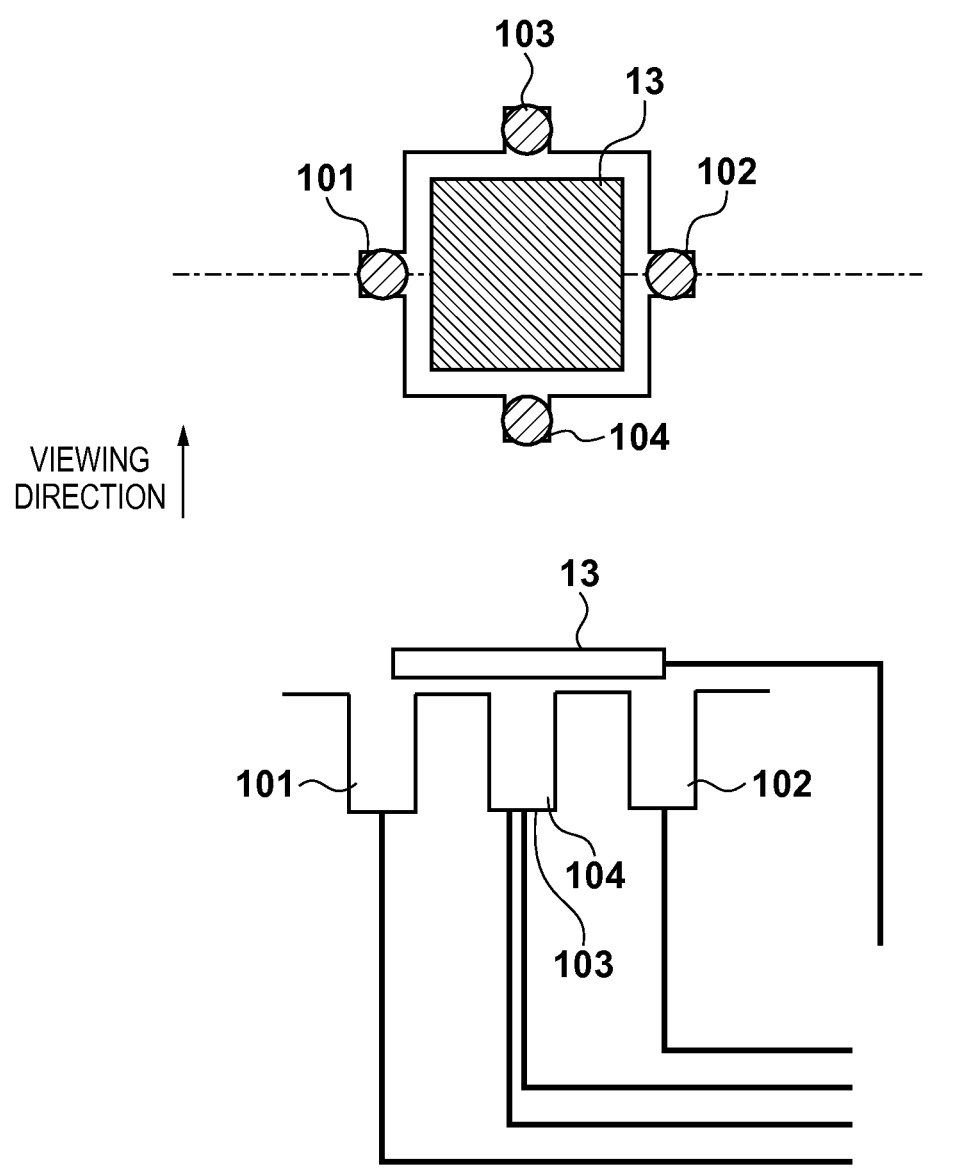
FIG. 10 is a view showing a detector for aligning the position of an electron beam on the detector.

FIG. 10 illustrates an example of a configuration in which alignment detectors 101 to 104 for aligning the incident positions of electron beams are set in four known portions at known positions relative to a detector 13 on a stage 12 which surrounds the detector 13. The detector 13 and four alignment detectors 101 to 104 can also be integrated as one detection system. In the second embodiment, the alignment detectors 101 to 104 serve as, for example, sensors which detect incident electron beams. In the second embodiment, a Faraday cup which generates a signal upon incidence of an electron beam is used as each of the alignment detectors 101 to 104.

Each of the alignment detectors 101 to 104 may be a combination of a mark formed on the stage 12 in the vicinity of the detector 13, and a mark position detection device which detects the position of the mark. The mark may generate a signal upon incidence of an electron beam. In the second embodiment, the coordinates of the incident position of an electron beam on the detector 13 can be obtained with high accuracy with reference to the positions of the alignment detectors 101 to 104.

FIG. 11 is a block diagram showing the configuration of a data collecting unit 21 which performs signal processing of the outputs from the detector 13 and alignment detectors 101 and 102 shown in FIG. 10. The data collecting unit 21 includes a signal processing circuit which obtains the coordinates of the incident position of an electron beam on the detector 13, based on data output from the detector 13, a timing signal of the detector 13, and the timing at which electron beams are incident on the alignment detectors 101 and 102. A detector output data collecting unit 111 has a block configuration including a signal switch 30 and signal processing circuits 35 to 50 as described with reference to FIG. 2. A detector position data collecting unit 112 includes a charge-to-voltage conversion circuit. A detector pulse timing measurement circuit 114 binarizes signals output from the detector output data collecting unit 111, and a preamplifier 31 built into the detector position data collecting unit 112, and performs signal processing of the timing signal positions of edges to obtain the time between pulses. With this operation, a controller 20 can obtain the coordinates of the incident position of an electron beam on the detector 13 using the deflection speed of the electron beam.

FIG. 12 shows changes in four signals with time. Time on the time axis elapses from the left to the right. The uppermost portion indicates a change in charge signal as electron beams are incident on the alignment detectors 101 and 102. A signal 121 serves as a charge signal output as an electron beam scans on the alignment detector 101 shown in FIG. 10. Similarly, a signal 122 serves as a signal output from the preamplifier 31 as an electron beam scans on the alignment detector 102. The second line in the timing chart shows the output from a charge-to-voltage conversion circuit as an electron beam scans on the detector 13. A signal 123 indicates the timing at which the incident position of an electron beam switches from an insensitive portion to a sensitive portion on the detector 13. A signal 124 indicates the timing at which the incident position of an electron beam switches from the sensitive portion to the insensitive portion on the detector 13.

The third line in the timing chart indicates a timing signal obtained by binarizing an analog signal output from the preamplifier 31 of each of the alignment detectors 101 and 102. The fourth line in the timing chart indicates a timing signal obtained by binarizing the timing of the second analog signal (the portion of the signal 124 has its polarity changed). From timing signals on the third and fourth lines in the timing chart, pulse intervals T1, T2, and T3 can be obtained. As long as the deflection speed of an electron beam can be determined, the coordinates of the position of the electron beam on the detector 13 can be determined. Although an electron beam is continuously scanned to obtain a signal, the ON/OFF position of the electron beam on the detector 13 can be obtained by controlling the ON/OFF time of the electron beam upon ON/OFF scanning of the electron beam using a blanker function. The controller 20 calibrates the deflection speed in advance to create a data table of T1, T2, and T3.

The controller 20 can perform calibration confirmation of the deflection speed by a comparison with reference data. Since the controller 20 controls the position of an electron beam using the deflector 9, it is possible to specify the coordinates of the incident position of the electron beam in the horizontal direction (X-direction) as long as the deflection position of an electron beam incident on the position of the Faraday cup can be determined. The controller 20 can control the incident position of an electron beam in the Y-direction by controlling the deflection position of the electron beam in the vertical direction (Y-direction) in the same way as in the X-direction. The position of an electron beam incident on the detector 13 can be obtained with high accuracy by determining both the X- and Y-coordinates of the deflection control position of the electron beam.

An example in which the charged particle beam apparatus according to the present invention is applied to a drawing apparatus which draws a pattern on a substrate with a plurality of electron beams has been described in the first and second embodiments. However, the present invention is also applicable to, for example, an electron microscope and a drawing apparatus which draws a pattern on a substrate with a plurality of charged particle beams of another type such as ion beams.

[Method of Manufacturing Article]

A method of manufacturing an article according to an embodiment of the present invention is suitable for manufacturing various articles including a microdevice such as a semiconductor device and an element having a microstructure. This method can include a step of forming a latent image pattern on a photosensitive agent, applied on a substrate, using the above-mentioned drawing apparatus (a step of performing drawing on a substrate), and a step of developing the substrate having the latent image pattern formed on it in the forming step. This method can also include subsequent known steps (for example, oxidation, film formation, vapor deposition, doping, planarization, etching, resist removal, dicing, bonding, and packaging). The method of manufacturing an article according to this embodiment is more advantageous in terms of at least one of the performance, quality, productivity, and manufacturing cost of an article than the conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-042386 filed Feb. 28, 2012, which is hereby incorporated by reference herein in its entirety.

What is claimed is:

1. A charged particle beam apparatus comprising:
a detector, having a detection surface, configured to perform an intensity detection on a charged particle beam incident on the detection surface;
an adjusting unit configured to perform an intensity adjustment on the charged particle beam based on a result of the intensity detection;
a processing unit configured to perform a process on an object with the charged particle beam on which the intensity adjustment has been performed; and
a changing unit configured to change a relative position of the charged particle beam with respect to the detection surface so that the charged particle beam, which has been incident on a first position on the detection surface, on which the intensity detection has been performed by the detector, on which the intensity adjustment have been performed by the adjusting unit and with which the process on the object has been performed by the processing unit, is incident on a second position different from the first position on the detection surface.

2. The apparatus according to claim 1, wherein the changing unit includes at least one of a deflector configured to deflect the charged particle beam, and a driving device configured to move the detector.

3. The apparatus according to claim 1, wherein the changing unit is configured to change each of the target incident positions regularly.

4. The apparatus according to claim 1, wherein the changing unit is configured to change each of the target incident positions randomly.

5. The apparatus according to claim 1, wherein the adjusting unit is configured to correct an output from the detector based on a sensitivity distribution of the detection surface, and an incident position of the charged particle beam on the detection surface, and to obtain an intensity of the charged particle beam based on the corrected output.

6. The apparatus according to claim 1, further comprising:
a mark formed at a known position relative to the detector, and a mark position detection device configured to detect a position of the mark with a charged particle beam,
wherein the changing unit is configured to control a relative position between a charged particle beam and the detector based on the position of the mark detected by the mark position detection device so that a charged particle beam is incident on one of the target incident positions.

7. The apparatus according to claim 6, wherein an aperture is formed in the mark, the mark position detection device being configured to detect the charged particle beam incident thereon via the aperture.

8. The apparatus according to claim 6, wherein the mark position detection device includes a Faraday cup.

9. The apparatus according to claim 1, wherein the apparatus is configured to perform drawing on a substrate with a charged particle beam.

10. The apparatus according to claim 1, wherein the changing unit is configured to change the relative position of the charged particle beam with respect to the detection surface so that the charged particle beam, which has been incident on the second position on the detection surface, on which the intensity detection has been performed by the detector, on which the intensity adjustment have been performed by the adjusting unit and with which the process on the object has been performed by the processing unit, is incident in a third position different from the first position and different from the second position on the detection surface.

11. A method of manufacturing an article, the method comprising:
performing drawing on a substrate using a drawing apparatus;
developing the substrate having undergone the drawing; and
processing the developed substrate to manufacture the article,
wherein the drawing apparatus performs drawing on the substrate with a charged particle beam,
the apparatus including:
a detector, having a detection surface, configured to perform an intensity detection on a charged particle beam incident on the detection surface; and
an adjusting unit configured to perform an intensity adjustment on the charged particle beam based on a result of the intensity detection;
a processing unit configured to perform a process on an object with the charged particle beam on which the intensity adjustment has been performed; and
a changing unit configured to change a relative position of the charged particle beam with respect to the detection surface so that the charged particle beam, which has been incident on a first position on the detection surface, on which the intensity detection has been performed by the detector, on which the intensity adjustment have been performed by the adjusting unit and with which the process on the object has been performed by the processing unit, is incident on a second position different from the first position on the detection surface.

* * * * *